United States Patent [19]
Mori et al.

[11] Patent Number: 5,659,199
[45] Date of Patent: Aug. 19, 1997

[54] RESIN SEALED SEMICONDUCTOR DEVICE

[75] Inventors: Ryuichiro Mori; Shunichi Abe; Tatsuhiko Akiyama; Michitaka Kimura, all of Tokyo, Japan

[73] Assignee: Mitsubishi Denki Kabushiki Kaisha, Tokyo, Japan

[21] Appl. No.: 629,149

[22] Filed: Apr. 8, 1996

[30] Foreign Application Priority Data

Oct. 30, 1995 [JP] Japan ................................ 7-281873

[51] Int. Cl.$^6$ .......................... H01L 23/02; H01L 23/495
[52] U.S. Cl. ................................ 257/676; 257/666
[58] Field of Search ................................ 257/676, 666

[56] References Cited

U.S. PATENT DOCUMENTS 4,952,999  8/1990  Robinson et al. ................ 257/676

FOREIGN PATENT DOCUMENTS

| 38-249341 | 10/1963 | Japan . | |
| 2246359 | 10/1990 | Japan . | |
| 4-15945 | 1/1992 | Japan | 257/676 |
| 5-03280 | 1/1993 | Japan | 257/676 |

*Primary Examiner*—Mahshid D. Saadat
*Assistant Examiner*—S. V. Clark
*Attorney, Agent, or Firm*—Leydig, Voit & Mayer

[57] ABSTRACT

A resin sealed semiconductor device includes a lead frame having a die pad; a semiconductor element mounted on the die pad; a resin sealing the lead frame and the semiconductor element, the die pad including a plurality of through holes where the semiconductor element is mounted; and a resin film bonding the semiconductor element to the die pad.

8 Claims, 2 Drawing Sheets

RESIN SEALED SEMICONDUCTOR DEVICE

BACKGROUND OF THE INVENTION

1. Field of the Invention

The present invention relates to a resin sealed semiconductor device in which a semiconductor element is mounted on a die pad of a lead frame and sealed in a resin.

2. Discussion of Background

In a conventional resin sealed semiconductor device, occurrence of package cracking caused by separation of a metal die pad and resin poses a serious issue. Therefore, various proposals have conventionally been carried out to prevent package cracking. FIG. 4 shows an example thereof wherein numeral 1 designates a die pad of a lead frame, numeral 2 designates a semiconductor element, numeral 3 designates solder bonding the semiconductor element 2 to the die pad 1 and numeral 4 designates a number of dimples on the back face of the die pad 1. In the example of FIG. 4, an anchoring effect with respect to a sealing resin (not shown) is produced by the dimples 4 whereby the separation of the sealed resin from the die pad becomes much more difficult and package cracking can be prevented to some degree. However, in this semiconductor device the formation of the dimples 4 can be performed only by an etching process and accordingly, the production cost of the lead frame including the die pad 1 is increased.

Therefore, a semiconductor device has conventionally been proposed as shown in FIG. 5 where an anchoring effect is achieved between the die pad 1 and a sealing resin (not shown) by forming a plurality of through holes 5 in the die pad 1 (for example, Japanese Unexamined Patent Publication No. Sho. 56-104459, Japanese Unexamined Patent Publication No. Sho. 63-249341, Japanese Unexamined Patent Publication No. Hei 2-246349 and the like). In the semiconductor device including a plurality of through holes 5 in the die pad 1, the through holes 5 can be formed by a punching process and, therefore, the lead frame can be manufactured at a low cost.

However, in such a conventional semiconductor device, when a paste material 6 or solder is used for bonding the semiconductor element 2 to the die pad 1, as shown in FIG. 5, the paste material 6 or solder sinks into the through holes 5 of the die pad 1 and the sealing resin does not fill up the through holes 5. As a result, the anchoring effect by the through holes 5 is not provided.

Further, there is known a conventional semiconductor device in which the through holes 5 are located only at peripheral portions of the die pad 1 where the semiconductor element 2 is not mounted to prevent the paste material 6 or solder from sinking into the through holes 5 of the die pad 1. However, in such a semiconductor device, the through holes are not located at a portion of the die pad 1 corresponding to the back face of the semiconductor element 2 and accordingly, separation is apt to occur between the portion of the die pad 1 where the through holes are not present and the sealing resin.

Further, there is known a conventional semiconductor device in which the base material 6 or solder is prevented from sinking into the through holes 5 by providing comparatively wide mutual intervals between the through holes 5 and by interspersing the paste material 6 or solder in the intervals. However, in such a semiconductor device, it is necessary to provide comparatively wide intervals between the through holes 5 and accordingly, the number of the through holes 5 is decreased and separation of the sealing resin from the die pad 1 is apt to occur. Further, the sealing resin which has entered the through holes 5 is brought into direct contact with the back face of the semiconductor element 2 and therefore, separation of the sealing resin from the back face of the semiconductor element 2 is apt to occur which gives rise to easy cracking of the package.

SUMMARY OF THE INVENTION

The present invention has been made in view of the problems of the conventional technologies and it is an object of the present invention to provide a resin sealed semiconductor device preventing package cracking and reducing production costs.

According to a first aspect of the present invention there is provided a resin sealed semiconductor device comprising:

a lead frame having a die pad; and a semiconductor element mounted on the die pad;

a resin sealing the lead frame and the semiconductor element including a plurality of through holes at a portion of the die pad where the semiconductor element is mounted and the semiconductor element is bonded to the die pad by a resin film.

According to a second aspect of the present invention, the resin film has a first dimension at each side shorter than each side of the semiconductor element by at least 0.5 mm.

According to a third aspect of the present invention, the plurality of through holes are proximate to each other with mutuals pacing of not more than 1.0 mm.

According to a fourth aspect of the present invention, a modulus of elasticity of the resin film is not more than 10 MPa at a temperature of 200° C.

In the resin sealing type semiconductor device according to the present invention, the semiconductor element is bonded to the die pad with a resin film. Therefore, the paste material or solder does not enter the through holes as in the conventional technologies even if a number of through holes are located in the die pad most densely at a narrow pitch. Therefore, occurrence of package cracking can be restrained by minimizing the separation of the sealing resin from the die pad since through holes can be densely formed in the die pad. Further, the resin film is interposed between the semiconductor element and the die pad and accordingly, there is no easy separation as in the conventional technology where the back face of the semiconductor element and the sealing resin are brought into direct contact with each other. Moreover, the resin film interposed between the semiconductor element and the die pad provides an enhanced interface bonding force between the film material and the sealing resin, so that separation is considerably reduced whereby package cracking is considerably reduced. Further, since through holes are formed in the die pad instead of dimples the die pad (lead frame) can be manufactured by a punching process at low cost.

Further, according to the present invention, each side of the resin film is shorter than each side of the semiconductor element by at least 0.5 mm whereby no portion (edge portion) of the film material projects from a face bonded to the semiconductor element and is separated from the die pad whereby the bonding between the die pad and the semiconductor element is deteriorated.

Further, according to the present invention the through holes are formed densely by bringing them proximate to each other such that the mutual interval is no more than 1 mm whereby the anchoring effect of the through holes is enhanced and separation of the sealing resin from the die pad is prevented even if the sealing resin is moistened.

Further, according to the present invention the modulus of elasticity of the resin film is no more than 10 MPa at a temperature of 200° C. whereby a difference between the thermal expansion coefficient of a silicon semiconductor element and the thermal expansion coefficient of a copper alloy die pad can be absorbed by the resin film and warping caused in the conventional semiconductor device by the difference between the thermal expansion coefficients of the semiconductor element and the die pad is prevented.

DETAILED DESCRIPTION OF THE PREFERRED EMBODIMENTS

Figure 1:
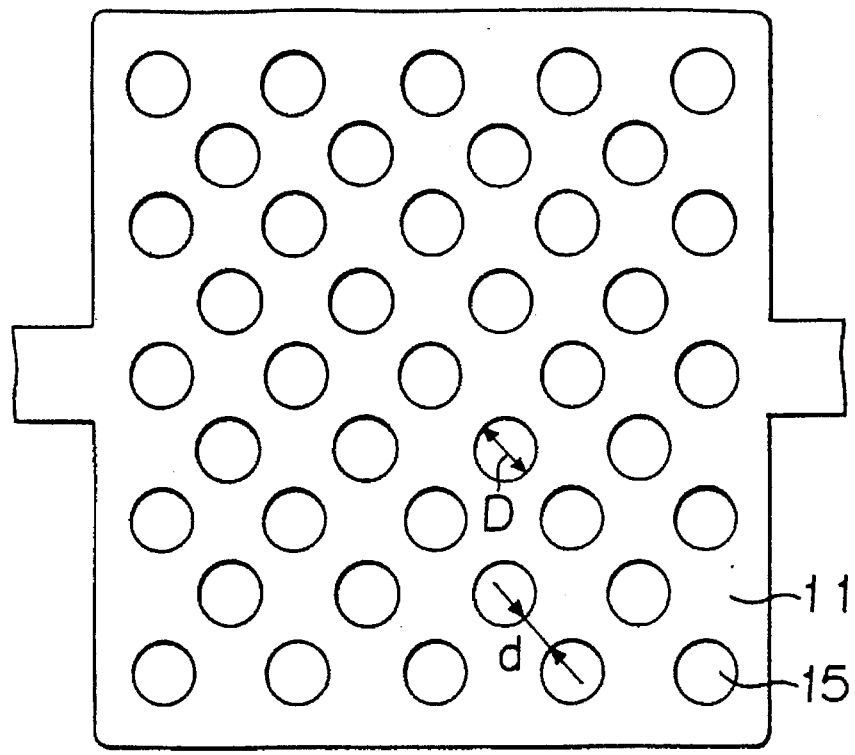
FIG. 1 is a plan view showing a die pad of a resin sealed semiconductor device according to an embodiment of the present invention.
Figure 2:
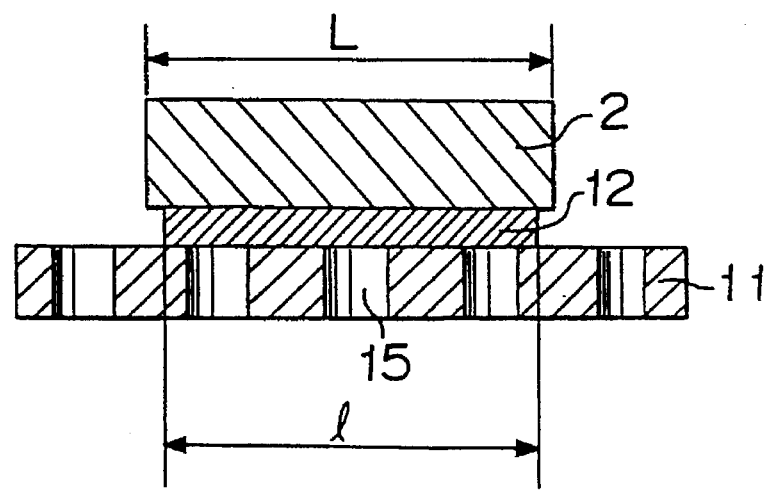
FIG. 2 is a sectional view of the resin sealed semiconductor device according to the embodiment of FIG. 1.

An explanation will be given of embodiments of the present invention in reference to the drawings as follows. FIG. 1 is a plan view showing a die pad of a resin sealed semiconductor device for mounting a semiconductor element according to the embodiment and FIG. 2 is a sectional view showing an example where the semiconductor element is bonded to the die pad of FIG. 1. In FIG. 1 and FIG. 2, numeral 2 designates a semiconductor element, numeral 11 designates a die pad and numeral 15 designates through holes. As shown in FIG. 2, in the embodiment, the semiconductor element 2 is bonded to the die pad 11 by a resin film 12 having a flat surface and a uniform thickness.

' In this embodiment, for example, the following resin film 12 is used. That is, the thickness of the resin film 12 in FIG. 2 is approximately 25 μm and the material is electrically nonconductive although it contains a silver filler. The film material 12 has a one-layer structure, is thermosetting, and bonds on the front surface and the back face of the film. In die-bonding the semiconductor element 2 with the resin film 12, the resin film 12 is heated to approximately 230° C. and is pressed by a load of approximately 50 g so that the bonding is ensured. As the resin film 12, other than the above-mentioned example, an electrically conducting material having an increased silver filler content, a material having a three-layer structure in which bonding layers are provided at both surfaces of a base material, a material having a thermoplastic resin component, and the like can be used. Moreover, in the embodiment, as the resin film material 12, for example, a conductive bonding film for die bonding capable of performing heat treatment in bonding at comparatively low temperatures as in a conventional silver paste which has been disclosed in Japanese Unexamined Patent Publication No. Hei. 6-145639, may be used.

Figure 3:
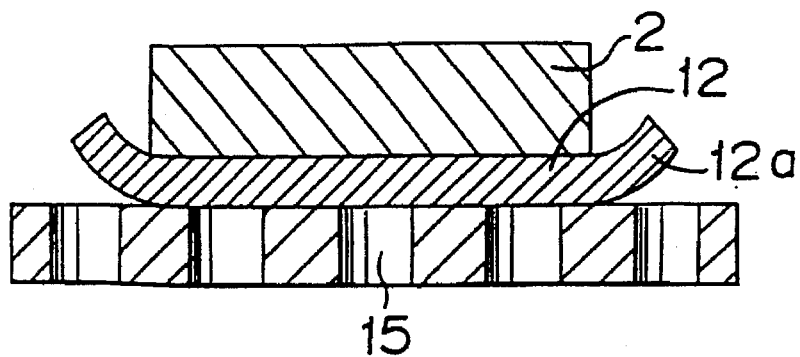
FIG. 3 is a sectional view for explaining inconvenience in the resin sealed semiconductor device according to the present invention in which each side of a resin film is longer than each side of a semiconductor element.
Figure 4:
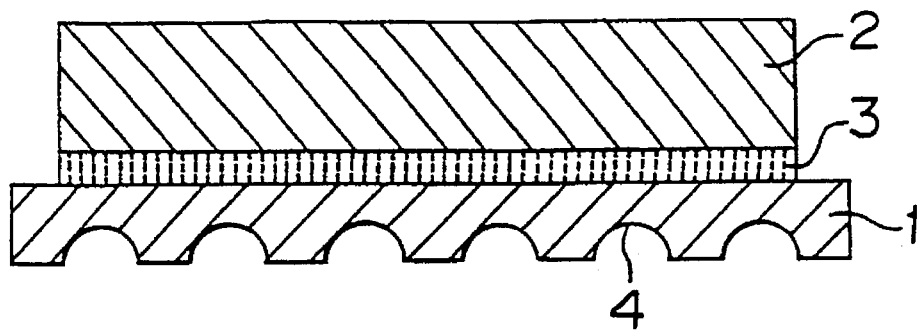
FIG. 4 is a sectional view of a conventional resin sealed semiconductor device having a die pad including dimples.

Also, as shown in FIG. 2, a length l of each side of the resin film material 12 is shorter than a length L of each side of the semiconductor element 2. The reason is that, when the length of each side of the film material 12 is longer than that of the semiconductor element 2, as shown in FIG. 3, portions 12a of the film material 12 project from the bonding face of the semiconductor element 2 and separate from the die pad 11 and the bonding performance of the semiconductor element 2 and the die pad 12 is deteriorated. Normally, the positioning accuracy of the semiconductor element 2 is ±0.1 mm and the positioning accuracy of the film material 12 is approximately ±0.22 mm. Therefore, if a relative shift of $(0.1^2+0.2^2)^{1/2}=0.22$ mm may occur along one side and accordingly, the length of each side of the film material 12 should be smaller than the length of each side of the semiconductor element 2 by 0.5 mm (>0.22 mm×2) or more.

Further, a distance d (refer to FIG. 1) between the through holes 15 is 1.0 mm or less. If the distance d is larger than 1.0 mm, when a user mounts the semiconductor device on a substrate, in case where the sealing resin is moistened, the sealing resin may separate from the back face of the die pad 11 and package cracking may occur.

Further, in the embodiment a diameter D (refer to FIG. 1) of the through hole 15 is 1.0 mm or less. When the diameter D is larger than 1.0 mm, the film material 12 hangs down in the through holes 15 and air bubbles enter between the film material 12 and the semiconductor element 2.

Figure 5:
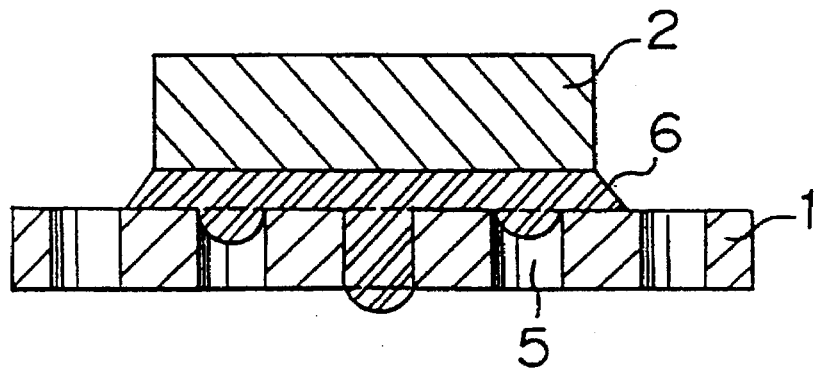
FIG. 5 is a sectional view of a conventional resin sealed semiconductor device having a die pad including through holes

Further, where the die pad 11 is especially made of a copper alloy, the thermal expansion coefficient (approximately $3.5\times10^{-6}$ 1/° C.) of silicon of the semiconductor element 2 and the thermal expansion coefficient (approximately $17\times10^{-6}$ 1/° C.) of a copper alloy forming the lead frame, are considerably different from each other. Therefore there may be warping due to the temperature change after bonding (for example, refer to FIG. 5 of Japanese Examined Patent Publication No. Hei. 5-79173). To prevent warping the resin film material 12 has a modulus of elasticity of 10 MPa or less at a temperature of 200° C. As shown in Table 1, when the modulus of elasticity of the film material 12 at a high temperature (200° C.) is 10 MPa or less, the film material 12 absorbs the difference of the thermal coefficients of silicon and a copper alloy and therefore, warping of the semiconductor device due to the temperature change after bonding can be restrained.

TABLE 1

| High temperature modulus of elasticity of film (200° C.) | 6.5 MPa | 80 MPa | 400 MPa |
|---|---|---|---|
| Amount of warp of a semiconductor having 10 mm length (μm) | 10 μm | 20 μm | 50 μm |

As stated above, according to the present invention, through holes are provided all over the face of a die pad most densely (at a narrow pitch) and a semiconductor element and the die pad are bonded with a resin film. Therefore, the die pad (lead frame) can be manufactured by a punching process at a low cost and further, a resin sealed semiconductor device resistant to package cracking can be provided. Further, by marking each side of the film material shorter than each side of the semiconductor element by at least 0.5 mm, no portion of the film material projects from a bonding face of the semiconductor element for separation, whereby bonding performance of the semiconductor element and the die pad are improved.

Further, the through holes are dense and are spaced at mutual intervals of no more than 1.0 mm, by which the anchoring effect of the through holes is enhanced and separation of the sealing resin from the die pad can be prevented even if the sealing resin is moistened.

Further, the film material 12 absorbs the difference between the thermal expansion coefficient of the semiconductor element and the thermal expansion coefficient of the die pad of a copper alloy by having a modulus of elasticity of 10 MPa or less at a temperature of 200° C., whereby warping caused by the difference of the thermal expansion coefficients of the semiconductor element and the die pad in the conventional semiconductor device can be prevented.

What is claimed is:

1. A resin sealing semiconductor device comprising:

a lead frame having a die pad;

a semiconductor element mounted on the die pad, the semiconductor element having sides;

a resin sealing the lead frame and the semiconductor element wherein the die pad includes a plurality of through holes where the semiconductor element is mounted; and a resin film bonding the semiconductor element to the die pad, the resin film having sides, each side of the resin film being shorter than a corresponding side of the semiconductor element.

2. The resin sealing semiconductor device according to claim 1, wherein the sides of the resin film are shorter than the corresponding sides of the semiconductor element by at least 0.5 mm.

3. A resin sealing semiconductor device comprising:

a lead frame having a die pad;

a semiconductor element mounted on the die pad;

a resin sealing the lead frame and the semiconductor element wherein the die pad includes a plurality of through holes where the semiconductor element is mounted, the through holes being spaced from each other by no more than 1.0 mm; and a resin film bonding the semiconductor element to the die pad.

4. The resin sealing semiconductor device according to claim 1, wherein the through holes are spaced from each other by no more than 1.0 mm.

5. A resin sealing semiconductor device comprising:

a lead frame having a die pad;

a semiconductor element mounted on the die pad;

a resin sealing the lead frame and the semiconductor element wherein the die pad includes a plurality of through holes where the semiconductor element is mounted; and a resin film bonding the semiconductor element to the die pad, the resin film having a modulus of elasticity no more than 10 MPa at 200° C.

6. The resin sealed semiconductor device according to claim 1, wherein the resin film has a modulus of elasticity no more than 10 MPa at 200° C.

7. The resin sealed semiconductor device according to claim 3, wherein the resin film has a modulus of elasticity no more than 10 MPa at 200° C.

8. The resin sealed semiconductor device according to claim 4, wherein the resin film has a modulus of elasticity no more than 10 MPa at 200° C.

* * * * *

UNITED STATES PATENT AND TRADEMARK OFFICE
CERTIFICATE OF CORRECTION

PATENT NO. : 5,659,199
DATED : August 19, 1997
INVENTOR(S) : Mori et al.

It is certified that error appears in the above-indentified patent and that said Letters Patent is hereby corrected as shown below:

Title page,
Item 56, References Cited, (Foreign Patent Documents)
change "38-249341" to --63-249341--;

Column 5, Line 12, change "sealing" to --sealed--;

Line 25, change "sealing" to --sealed--;

Line 29, change "sealing" to --sealed--;

Column 6, Line 8, change "sealing" to --sealed--;

Line 11, change "sealing" to --sealed--.

Signed and Sealed this

Thirteenth Day of January, 1998

Attest:

BRUCE LEHMAN

*Attesting Officer*     *Commissioner of Patents and Trademarks*